(12) United States Patent
Kosai

(10) Patent No.: US 7,446,600 B2
(45) Date of Patent: Nov. 4, 2008

(54) FILTER ADJUSTMENT CIRCUIT

(75) Inventor: Shohei Kosai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 11/695,204

(22) Filed: Apr. 2, 2007

(65) Prior Publication Data
US 2007/0229152 A1  Oct. 4, 2007

(30) Foreign Application Priority Data
Apr. 3, 2006 (JP) ............... 2006-102183

(51) Int. Cl.
*H03B 1/00* (2006.01)
(52) U.S. Cl. ........................................ 327/553
(58) Field of Classification Search .............. 327/551, 327/552, 553, 556, 557, 558, 559
See application file for complete search history.

(56) References Cited

U.S. PATENT DOCUMENTS

| 6,057,736 | A | 5/2000 | Kim et al. | |
| 6,452,443 | B1* | 9/2002 | Thompson et al. | 327/553 |
| 7,268,711 | B1* | 9/2007 | Hofer | 341/118 |
| 2005/0148309 | A1 | 7/2005 | Fukusen et al. | |

FOREIGN PATENT DOCUMENTS

JP  2002-223148  8/2002

OTHER PUBLICATIONS

Jan-Michael Stevenson, et al., "An Accurate Quality Factor Tuning Scheme for IF and High-Q Continuous-Time Filters", IEEE Journal of Solid-State Circuits, vol. 33, No. 12, Dec. 1998, pp. 1970-1978.

* cited by examiner

*Primary Examiner*—Jeffrey S Zweizig
(74) *Attorney, Agent, or Firm*—Oblon, Spivak, McClelland, Maier & Neustadt, P.C.

(57) ABSTRACT

A filter adjustment circuit has a filter capable of adjusting a cut-off frequency that is composed of a plurality of integrators connected to each other, each of which has an amplifier, a resistor connected to an input of the amplifier, a capacitor connected between the input and the output of said amplifier, and a variable resistor connected between the input and the output of said amplifier; a reference frequency generating circuit that outputs a first signal having said cut-off frequency and outputs a second signal that is out of phase with respect to said first signal to said filter; a phase comparator that compares the phase of a third signal, which is said second signal processed by and output from said filter, with the phase of said first signal to determine whether or not the frequencies of the signals are equal to each other; a reference voltage generating circuit that generates a reference voltage having a desired amplitude value for determining a Q factor; an amplitude comparator that compares the amplitude value of said third signal with that of said reference voltage and outputs the comparison result; and a control circuit that adjusts the Q factor by outputting a control signal to said filter, thereby adjusting the frequency of said third signal to said cut-off frequency based on the comparison result from said phase comparator and adjusting the resistance value of said variable resistor based on the comparison result from said amplitude comparator to adjust the amplitude of said third signal to that of said reference voltage.

12 Claims, 14 Drawing Sheets

FIG. 1A
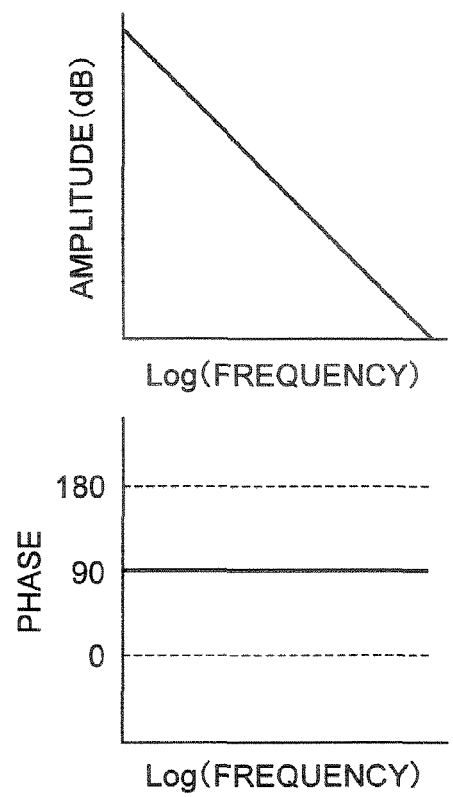
FIG. 1B
FIG. 2A
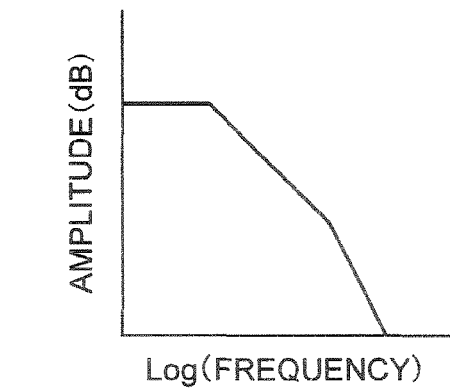
FIG. 2B

FILTER ADJUSTMENT CIRCUIT

CROSS-REFERENCE TO RELATED APPLICATIONS

This application is based upon and claims the benefit of priority from the prior Japanese Patent Application No. 2006-102183, filed on Apr. 3, 2006, the entire contents of which are incorporated herein by reference.

BACKGROUND OF THE INVENTION

1. Field of the Invention

The present invention relates to a filter adjustment circuit that adjusts the quality factor (Q factor) of an active filter, which incorporates an amplifier.

2. Background Art

Recently, active filters have been required to have a wider band. However, it is difficult to manufacture active filters having a wide band and a high Q factor as designed without variations in Q factor.

The Q factor varies due to variations of passive elements, such as resistors "R" capacitors "C" and inductors "L". In addition, the Q factor of the active filter varies due to a nonideal effect of the amplifier. While an ideal amplifier has infinite gain and band, an actual amplifier has finite gain and band.

For example, a conventional filter adjustment circuit comprises an input terminal, a reference signal generator, a filter (gm-C filter) having a control terminal for outputting a control signal for controlling filter characteristics, an output terminal for outputting a signal that has been input at the input terminal and passed through the filter, an amplitude detector section that receives the output signal of the filter and detects the amplitude of the signal, a phase comparator section that detects the phase difference between the signal before passing through the filter and the signal after passing through the filter, and a control section that inputs a reference signal to the filter, successively inputs a plurality of control signals to the control terminal of the filter, and determines the value of the control signal for normal use based on each amplitude detected by the amplitude detector section and each phase difference detected by the phase comparator section.

This filter adjustment circuit configured as described above adjusts the characteristic frequency and the Q factor of the gm-C filter (see "An Accurate Quality Factor Tuning Scheme for IF and High-Q Continuous-Time Filters", IEEE JOURNAL OF SOLID-STATE CIRCUITS, VOL. 33, NO. 12, DECEMBER 1998, for example).

However, the prior-art literature discloses only a method of adjusting the characteristic frequency of a gm-C filter and does not discloses any specific circuit configuration for adjusting the Q factor of an active filter.

Therefore, according to the prior art, when the Q factor varies due to the manufacturing condition or the like or due to a parasitic effect or a nonideal effect of the amplifier, the Q factor cannot be adjusted automatically.

As described above, conventional filter adjustment circuits have a disadvantage that it is difficult to produce a desired Q factor of a filter.

SUMMARY OF THE INVENTION

According one aspect of the present invention, there is provided: a filter adjustment circuit, comprising a filter capable of adjusting a cut-off frequency that is composed of a plurality of integrators connected to each other, each of which has an amplifier, a resistor connected to an input of the amplifier, a capacitor connected between the input and the output of said amplifier, and a variable resistor connected between the input and the output of said amplifier; a reference frequency generating circuit that outputs a first signal having said cut-off frequency and outputs a second signal that is out of phase with respect to said first signal to said filter; a phase comparator that compares the phase of a third signal, which is said second signal processed by and output from said filter, with the phase of said first signal to determine whether or not the frequencies of the signals are equal to each other; a reference voltage generating circuit that generates a reference voltage having a desired amplitude value for determining a Q factor; an amplitude comparator that compares the amplitude value of said third signal with that of said reference voltage and outputs the comparison result; and a control circuit that adjusts the Q factor by outputting a control signal to said filter, thereby adjusting the frequency of said third signal to said cut-off frequency based on the comparison result from said phase comparator and adjusting the resistance value of said variable resistor based on the comparison result from said amplitude comparator to adjust the amplitude of said third signal to that of said reference voltage.

According another aspect of the present invention, there is provided: a filter adjustment circuit comprising a filter capable of adjusting a cut-off frequency that is composed of a plurality of integrators connected to each other, each of which has an amplifier, a resistor connected to an input of the amplifier, a capacitor connected between the input and the output of said amplifier, and a variable resistor connected between the input and the output of said amplifier; an oscillator that is composed of a plurality of integrators connected to each other having the same configuration as said integrators and is capable of adjusting the oscillating frequency by adjusting the variable resistors of the integrators; a frequency detecting circuit that detects the oscillating frequency of said oscillator; and a control circuit that outputs a control signal to said oscillator to adjust said variable resistors of said integrators of said oscillator based on the detection result from said frequency detecting circuit to adjust said oscillating frequency to said cut-off frequency and outputs a control signal to said filter to adjust the resistance value of said variable resistors of said integrators of said filter to the adjusted resistance values of said variable resistors of said integrators of said oscillator.

BRIEF DESCRIPTION OF THE DRAWINGS

FIG. 1 shows a relationship between the frequency and the amplitude of the output of an ideal integrator and a relationship between the frequency and the phase of the output of the ideal integrator;

FIG. 2 shows a relationship between the frequency and the amplitude of the output of a nonideal integrator and a relationship between the frequency and the phase of the output of the nonideal integrator;

DETAILED DESCRIPTION

In the following, embodiments of the present invention will be described with reference to the drawings.

Embodiment 1

As described above, the Q factor of an active RC filter varies not only due to variations of a passive element, such as a resistor "R", a capacitor "C" and an inductor "L" but also due to a nonideal effect of an amplifier. While an ideal amplifier has infinite gain and band, an actual amplifier has finite gain and band.

In recent years, in particular, the active RC filter has been required to have wider band, as described above. However, it is difficult to manufacture the active RC filters having a wide band and a high Q factor as designed without variations in Q factor.

Now, an integrator of the active RC filter will be described.

FIG. 1 shows a relationship between the frequency and the amplitude of the output of an ideal integrator and a relationship between the frequency and the phase of the output of the ideal integrator. FIG. 2 shows a relationship between the frequency and the amplitude of the output of a nonideal integrator and a relationship between the frequency and the phase of the output of the nonideal integrator.

As shown in FIG. 1, the amplitude of the output of the ideal integrator monotonously increases as the frequency decreases. The phase of the output of the ideal integrator does not change when the frequency changes.

However, as shown in FIG. 2, the amplitude of the output of the nonideal integrator converges to a value as the frequency decreases. Besides, the phase of the output of the nonideal integrator changes when the frequency changes.

Thus, the integrator of the active RC filter has to be designed taking into account the nonideal effect of the amplifier.

Thus, transformation of a nonideal integrator having a nonideal amplifier into an ideal integrator having an ideal amplifier will be discussed below.

Figure 3:
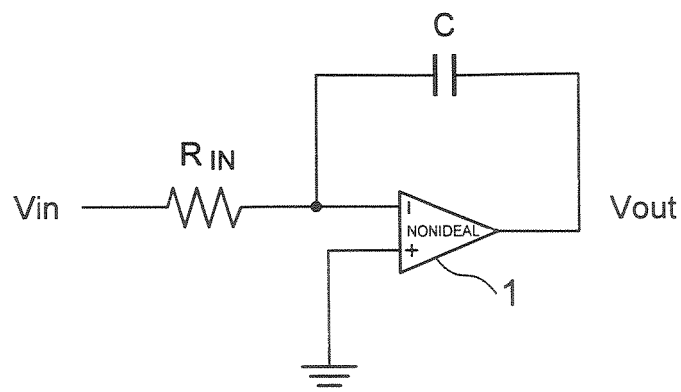
FIG. 3 is a circuit diagram of a nonideal integrator having a nonideal amplifier 1.
Figure 4:
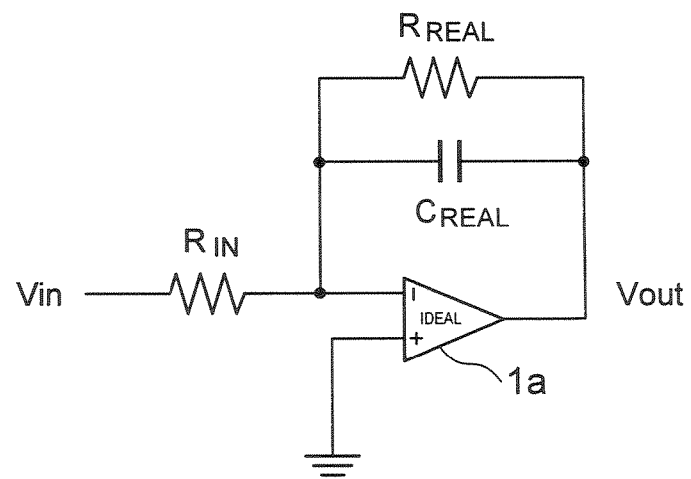
FIG. 4 is a circuit diagram of an ideal integrator having an ideal amplifier 1a, which is transformed from the circuit shown in FIG. 3.

FIG. 3 is a circuit diagram of a nonideal integrator having a nonideal amplifier 1. FIG. 4 is a circuit diagram of an ideal integrator having an ideal amplifier 1a, which is transformed from the circuit shown in FIG. 3.

In FIG. 3, the nonideal amplifier has a gain "A" which is a finite complex number. In FIG. 4, the ideal amplifier has a gain "A", which is infinite.

In the following, transfer functions of the integrators will be discussed to determine a parameter for producing a desired Q factor of the filter.

The transfer function of the nonideal integrator shown in FIG. 3 is expressed by the following Formula (1).

$$\frac{Vout}{Vin} = \frac{1}{\frac{1}{A} + j2\pi f CR_{in}\frac{(1+A)}{A}} \quad (1)$$

In this formula, the gain "A" is replaced with the following Formula (2). In the Formula (2), variables "a", "x" and "y" are real numbers.

$$A = a(x-jy)$$

$$x^2 + y^2 = 1 \quad (2)$$

Then, the transfer function of the nonideal integrator shown in FIG. 3 is rewritten into the following Formula (3).

$$\frac{Vout}{Vin} = \frac{1}{\frac{x - y2\pi f CR_{in}}{a} + j2\pi f CR_{in}\left(1 + \frac{x}{a} + \frac{y}{a2\pi f CR_{in}}\right)} \quad (3)$$

The transfer function of the ideal integrator shown in FIG. 4 is expressed by the following Formula (4).

$$\frac{Vout}{Vin} = \frac{1}{\frac{R_{in}}{R_{REAL}} + j2\pi f C_{REAL} R_{in}} \quad (4)$$

Supposing that the transfer function expressed by the Formula (3) equals to the transfer function expressed by the Formula (4), variables are expressed by the following Formulas (5) and (6) as a result of comparison in terms of the real part and the imaginary part.

$$\frac{Vout}{Vin} = \frac{\frac{1}{\frac{1}{R_4} + \frac{R_{in2}}{R_{real1}(R_3 + R_{real2})}}}{R_{in1}} \cdot \frac{\frac{1}{C_{real1} C_{real2} R_{in2} \frac{1}{\frac{1}{R_4} + \frac{R_{in2}}{R_{real1}(R_3 + R_{real2})}}}}{s^2 + \left(\frac{1}{R_{real1} C_{real1}} + \frac{1}{(R_3 + R_{real2})C_{real2}}\right)s + \frac{1}{C_{real1} C_{real2} R_{in2} \frac{1}{\frac{1}{R_4} + \frac{R_{in2}}{R_{real1}(R_3 + R_{real2})}}}}$$

(11)

$$\frac{R_{in}}{R_{REAL}} = \frac{x - y2\pi f C R_{in}}{a} \quad (5)$$

$$\left(1 + \frac{x}{a} + \frac{y}{a2\pi f C R_{in}}\right) 2\pi f C R_{in} = 2\pi f C_{REAL} R_{in} \quad (6)$$

Therefore, the resistance "$R_{REAL}$" and the capacitance "$C_{REAL}$" are expressed by the following Formulas (7) and (8), respectively.

$$R_{REAL} = \frac{aR_{in}}{x - y2\pi f C R_{in}} \quad (7)$$

$$C_{REAL} = C\left(1 + \frac{x}{a} + \frac{y}{a2\pi f R_{in} C}\right) = (1 + \alpha(f))C \quad (8)$$

Figure 5:
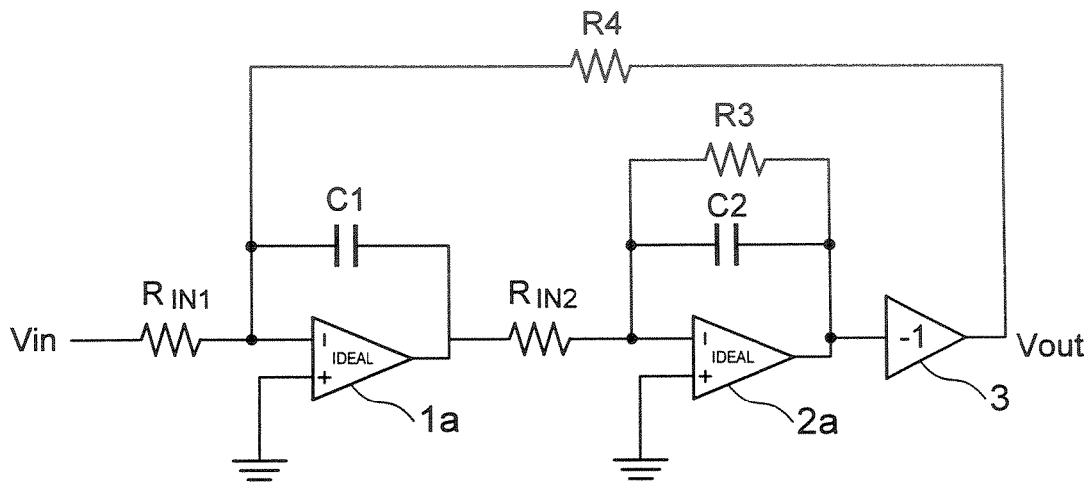
FIG. 5 is a circuit diagram of a second-order low pass filter incorporating ideal amplifiers.

Here, as a simple example, a second-order low pass filter (LPF), which is an active RC filter incorporating an ideal integrator, will be described. FIG. 5 is a circuit diagram of a second-order low pass filter incorporating ideal amplifiers. In FIG. 5, if the low pass filter has a differential structure, an inverting amplifier 3 can be omitted.

The transfer function of the second-order low pass filter shown in FIG. 5 is expressed by the following Formula (9).

$$\frac{Vout}{Vin} = \frac{R_4}{R_{IN1}} \cdot \frac{\frac{1}{C_1 C_2 R_{IN2} R_4}}{s^2 + \left(\frac{1}{R_3 C_1}\right)s + \frac{1}{C_1 C_2 R_{IN2} R_4}} \quad (9)$$

The Formula (9) can be rewritten as follows using a Q factor "$Q_{ideal}$", a current gain "$A_{ideal}$" and a cut-off frequency "$f_{ideal}$".

$$\frac{Vout}{Vin} = A_{ideal} \cdot \frac{(2\pi f_{ideal})^2}{s^2 + \left(\frac{2\pi f_{ideal}}{Q_{ideal}}\right)s + (2\pi f_{ideal})^2} \quad (10)$$

Figure 6:
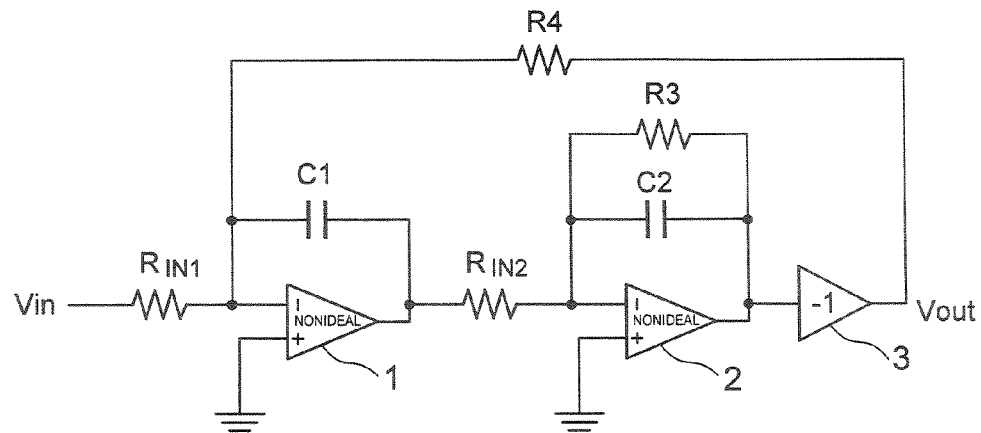
FIG. 6 is a circuit diagram of a second-order low pass filter incorporating nonideal amplifiers.

Considering the nonideal effect of the amplifier, ideal amplifiers 1a and 2a of the low pass filter shown in FIG. 5 are actually nonideal amplifiers 1 and 2 as shown in FIG. 6.

Figure 7:
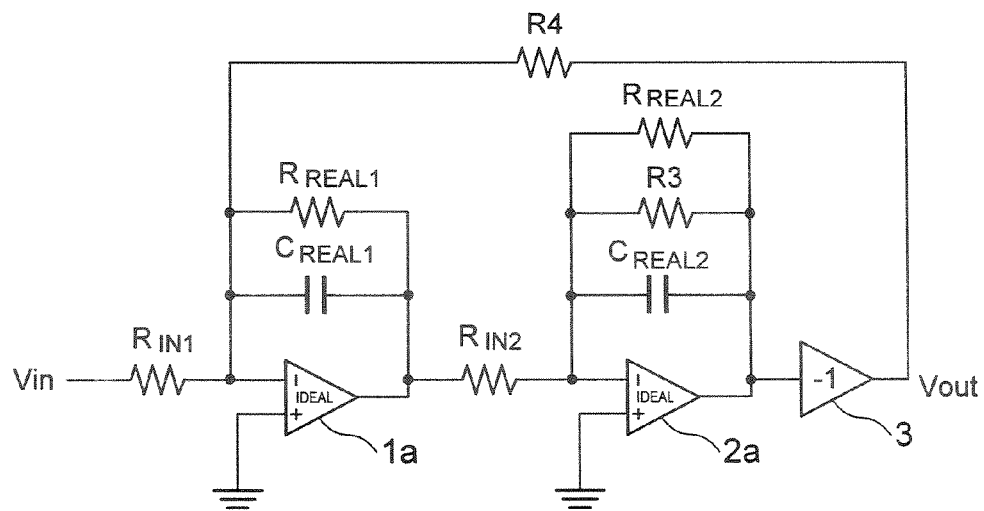
FIG. 7 shows an equivalent circuit of the low pass filter shown in FIG. 6 whose nonideal amplifiers 1 and 2 are replaced with the ideal amplifiers 1 and 2, respectively.

FIG. 7 shows an equivalent circuit of the low pass filter shown in FIG. 6 whose nonideal amplifiers 1 and 2 are replaced with the ideal amplifiers 1 and 2, respectively.

The transfer function of the low pass filter shown in FIG. 7 is expressed by the following Formula (11).

A nonideal Q factor "$Q_{real}$" and an ideal Q factor "$Q_{ideal}$" are expressed by the following Formulas (12a) and (12b), respectively.

$$Q_{real} = \frac{\frac{1}{\frac{1}{R_{real1} C_{real1}} + \frac{1}{(R_3 + R_{real2})C_{real2}}}}{\sqrt{C_{real1} C_{real2} R_{in2} \frac{1}{\frac{1}{R_4} + \frac{R_{in2}}{R_{real1}(R_3 + R_{real2})}}}} \quad (12a)$$

$$Q_{ideal} = R_3 \sqrt{\frac{C_2}{C_1 R_{in2} R_4}} \quad (12b)$$

A nonideal current gain "$A_{real}$" and an ideal current gain "$A_{ideal}$" are expressed by the following Formulas (13a) and (13b), respectively.

$$A_{real} = \frac{\frac{1}{\frac{1}{R_4} + \frac{R_{in2}}{R_{real1}(R_3 + R_{real2})}}}{R_{in1}} \quad (13a)$$

$$A_{ideal} = \frac{R_4}{R_{in1}} \quad (13b)$$

A nonideal cut-off frequency "$f_{real}$" and an ideal cut-off frequency "$f_{ideal}$" are expressed by the following Formulas (14a) and (14b), respectively.

$$f_{real0} = \frac{1}{2\pi \sqrt{C_{real1} C_{real2} R_{in2} \frac{1}{\frac{1}{R_4} + \frac{R_{in2}}{R_{real1}(R_3 + R_{real2})}}}} \quad (14a)$$

$$f_{idial} = \frac{1}{2\pi \sqrt{C_1 C_2 R_{in2} R_4}} \quad (14b)$$

Due to the nonideal effect of the amplifier, the band, the Q factor and the gain of the filter vary. In particular, at higher frequencies, the value of $x-y2\pi f C R_{in}$ is negative. Therefore, according to the Formula (7), the values of the resistances "$R_{real1}$" and "$R_{real2}$" are also negative ($R_{real1}$, $R_{real2}$<0). Then, according to the Formulas (12a) and (12b), the Q factor is greater than the ideal value.

The band of the filter is adjusted taking advantage of the fact that the phase rotation of the filter is 90 degrees in the case of $s=j2\pi f_0$ (in the case of the second-order low pass filter). Two pulses or sinusoidal waves having a period equivalent to the cut-off frequency "f0" and different in phase by 90 degrees are generated, and one of the two pulses is input to the second-order low pass filter.

At the cut-off frequency of the second-order low pass filter, the phase rotates 90 degrees. Therefore, if $2\pi f_{real0} < 2\pi f_{ideal}$, the phase of the output of the low-pass filter is delayed. If $2\pi f_{real0} > 2\pi f_{ideal}$, the phase of the output of the low-pass filter is advanced.

The phase difference can be detected, and the capacitances "C1" and "C2" can be increased or decreased by a factor of $(1+\beta)$ so that the value $2\pi f_{ideal0}$ is equal to the value $2\pi f_{ideal0}$, that is, $2\pi f_{real0} = 2\pi f_{ideal0}$.

Similarly, the resistances of all the resistors "R1" to "R4" can be increased or decreased by a factor of $(1+\beta)$.

The cut-off frequency "$f_{ideal}$" and the adjusted cut-off frequency "$f_{real2}$" are expressed by the following Formulas (15a) and (15b).

$$f_{ideal} = \frac{1}{2\pi\sqrt{C_1 C_2 R_{in2} R_4}} \quad (15a)$$

$$f_{real2} = \frac{1}{2\pi(1+\beta)\sqrt{C_{real1} C_{real2} R_{in2} \dfrac{1}{\dfrac{1}{R_4} + \dfrac{R_{in2}}{R_{real1}(R_3 + R_{real2})}}}} \quad (15b)$$

Based on the Formulas (8), (15a) and (15b), the value of $1+\beta$ is adjusted so that the relation expressed by the Formula (16) holds. Consequently, the adjusted cut-off frequency "$f_{real2}$" becomes equal to the cut-off frequency "$f_{ideal}$".

$$(1+\beta) = \frac{\sqrt{R_4}}{\sqrt{(1+\alpha_1)(1+\alpha_2)}\sqrt{\dfrac{1}{\dfrac{1}{R_4} + \dfrac{R_{in2}}{R_{real1}(R_3 + R_{real2})}}}} \quad (16)$$

$$\alpha_1 = \frac{x}{a} + \frac{y}{a 2\pi f R_{in1} C_1}$$

$$\alpha_2 = \frac{x}{a} + \frac{y}{a 2\pi f R_{in2} C_2}$$

Figure 8A:
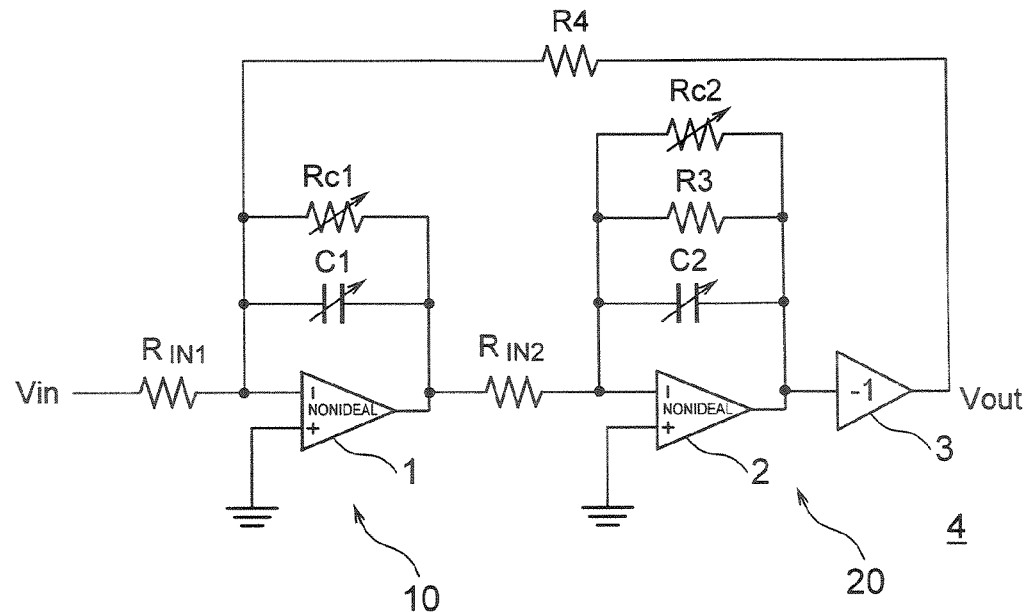
FIG. 8A is a circuit diagram of a low pass filter incorporating nonideal amplifiers used in this embodiment.

Then, the Q factor can be set to an ideal value by adding resistors "$R_{c1}$" and "$R_{c2}$" to the circuit as shown in FIG. 8A described later and adjusting the resistors.

The Q factor can be made approximately equal to the ideal value by making the amplitude of the output at the cut-off frequency equal to the ideal value represented by the Formula (17), which is calculated from the Formulas (12b) and (14b), where reference character "Vin" denotes the voltage amplitude of the cut-off frequency component of the input to the filter. The Q factor can be made only approximately equal to the ideal value because not only the Q factor but also the cut-off frequency varies due to adjustment of "$R_c$".

$$V_{in} * A_{ideal} * Q_{idel} = V_{in} * \frac{R_3}{R_{in1}} \sqrt{\frac{C_2 R_4}{C_1 R_{in2}}} \quad (17)$$

The actual approximate cut-off frequency "$f_{0\_New}$" after the adjustment is adjusted as expressed by the following Formula (18).

$$R_{C1} \approx -R_{real1}, R_{C2} \approx -R_{real2} \quad (18)$$

Therefore, according to this relation after the adjustment and the Formula (15b), the new cut-off frequency "$f_{0\_New}$" after the adjustment is approximately expressed by the following Formula (19).

$$f_{0\_NEW} \approx \frac{1}{2\pi(1+\beta)\sqrt{C_{real1} C_{real2} R_{in2} R_4}} \quad (19)$$

As can be seen, the new cut-off frequency "f0_New" differs from the ideal cut-off frequency $f_{ideal}$ by a factor of $$\frac{\sqrt{R_4}}{\sqrt{\dfrac{1}{\dfrac{1}{R_4} + \dfrac{R_{in2}}{R_{real1}(R_3 + R_{real2})}}}}.$$

If the difference is great, the cut-off frequency and the Q factor can be repeatedly adjusted to bring the values closer to their respective ideal values.

Furthermore, although the capacitances "$C_{real1}$" and "$C_{real2}$" and the resistances "$R_{real1}$" and "$R_{real2}$" have frequency characteristics, the characteristics of the low pass filter are substantially constant at frequencies other than the cut-off frequency. When $f < f_{ideal}$, where reference character f denotes the frequency of the output of the filter, a>>1 because of the characteristics of the amplifier. Therefore, the following relations result.

$R_{real1}, R_{real2} >> 1$, $C_{real1}, C_{real2} \approx C_1, C_2$

On the other hand, when $f > f_{ideal}$, where reference character "f" denotes the frequency of the output of the filter, the attenuation increases due to the nonideal effect of the amplifier, and the characteristics of the low pass filter is improved. In the case of the differential configuration, the inverting amplifier 3 can be omitted.

Now, a filter adjustment circuit according to this embodiment that adjusts the Q factor of a filter based on the principal described above will be described. In the following, adjustment of a second-order low pass filter will be described as an example. However, the present invention can be equally applied to any filter having a similar configuration.

FIG. 8A is a circuit diagram of a low pass filter incorporating a nonideal amplifier used in this embodiment.

As shown in FIG. 8A, a low pass filter 4 capable of adjusting the cut-off frequency has an amplifier 10 to which a signal "Vin" is input, an amplifier 20 that has an input connected to the output of the amplifier 10, an inverting amplifier 3 that has an input connected to the output of the amplifier 20 and outputs a signal "Vout", and a resistor "R4" connected between the output of the inverting amplifier 3 and a noninverting input of the amplifier 10.

The amplifier 10 has a nonideal amplifier 1 having a noninverting input connected to the ground potential, a resistor "Rin1" that is connected to an inverting input of the nonideal amplifier 1 at one end and receives the signal "Vin" at the other end, a variable resistor "Rc1" connected between the output of the nonideal amplifier 1 and the noninverting input thereof, and a variable capacitor "C1" connected between the noninverting input of the nonideal amplifier 1 and the output thereof in parallel with the variable resistor "Rc1".

The amplifier 20 has a nonideal amplifier 2 having a noninverting input connected to the ground potential, a resistor "Rin2" that is connected to an inverting input of the nonideal amplifier 2 at one end and connected to the output of the nonideal amplifier 1 at the other end, a variable resistor "Rc2" connected between the noninverting input of the nonideal amplifier 2 and the output thereof, a variable capacitor "C2" connected between the noninverting input of the nonideal amplifier 2 and the output thereof in parallel with the variable resistor "Rc2", and a resistor "R3" connected between the output of the nonideal amplifier 2 and the noninverting input thereof.

The filter 4 adjusts the cut-off frequency by adjusting the variable capacitors "C1" and "C2".

Figure 8B:
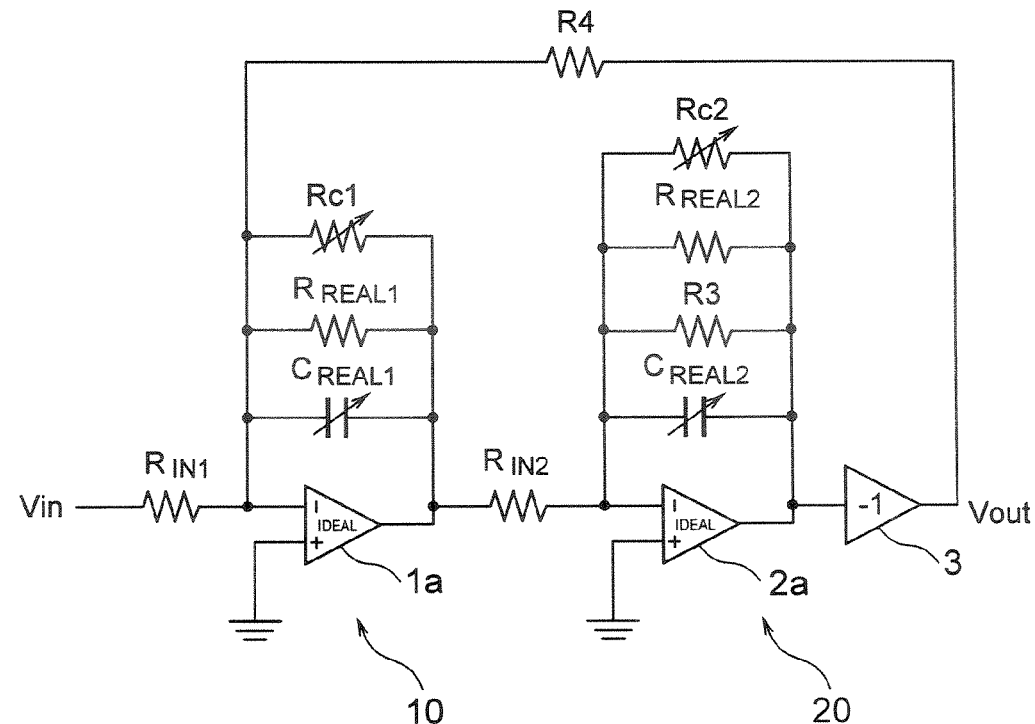
FIG. 8B is an equivalent circuit diagram taking into account the nonideal effect of the low pass filter shown in FIG. 8A.

Taking into account the nonideal effect of the low pass filter shown in FIG. 8A, the circuit diagram of FIG. 8A can be transformed into the equivalent circuit diagram of FIG. 8B.

Figure 9:
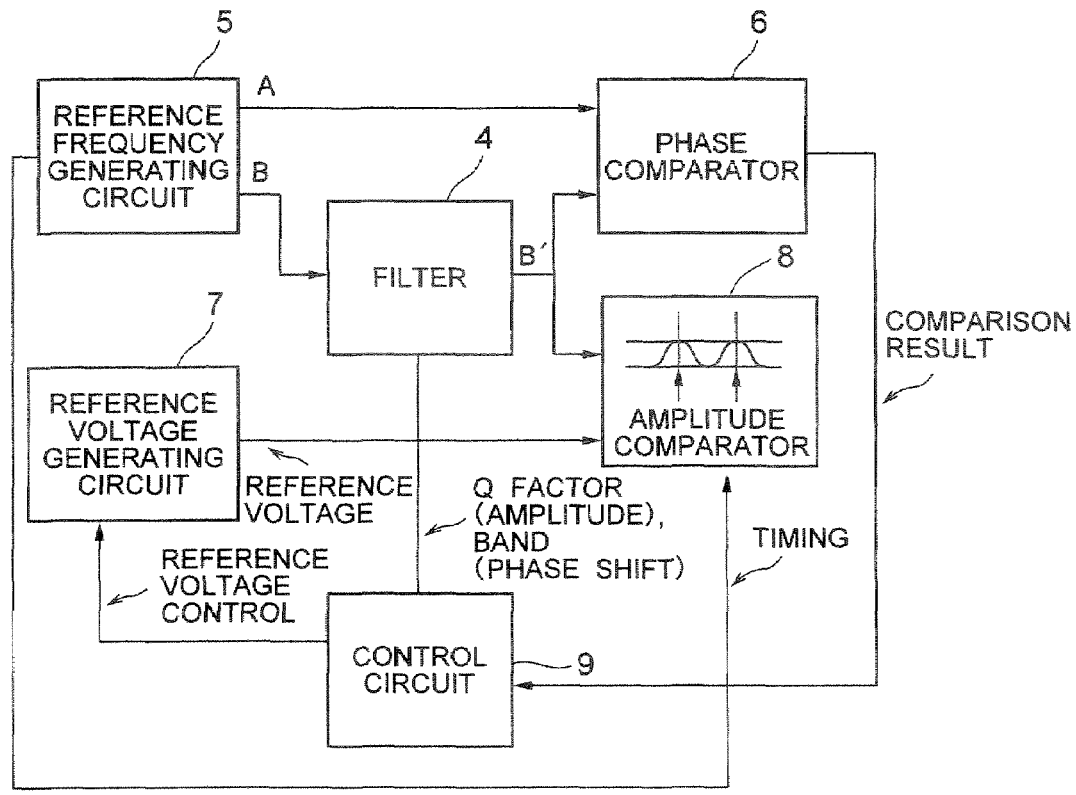
FIG. 9 is a diagram showing a configuration of a filter adjustment circuit according the embodiment 1 of the present invention.

FIG. 9 is a diagram showing a configuration of a filter adjustment circuit according the embodiment 1 of the present invention.

As shown in FIG. 9, a filter adjustment circuit 100 has the filter 4 capable of adjusting the cut-off frequency that is composed of a plurality of integrators connected to each other, each of which has an amplifier and a variable resistor connected between the input and the output of the amplifier.

Furthermore, the filter adjustment circuit 100 has a reference frequency generating circuit 5 that outputs a first clock signal "A" having the cut-off frequency and outputs a second clock signal "B" 90 degrees out of phase with respect to the first clock signal "A" to the filter 4, and a phase comparator 6 that compares the phase of a third signal "B'", which is the second clock signal "B" processed by and output from the filter 4, with the phase of the first clock signal "A" to determine whether or not the frequencies of the signals match with each other.

Figure 10:
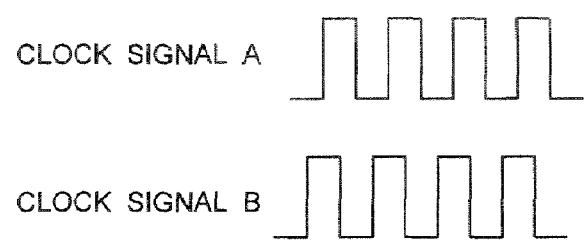
FIG. 10 shows exemplary waveforms of the clock signals "A" and "B" that are output of the reference frequency generating circuit according the embodiment of the present invention.

As an example of the output of the reference frequency generating circuit 5, FIG. 10 shows exemplary waveforms of the clock signals "A" and "B". As described above, the first clock signal "A" and the second clock signal "B" are 90 degrees out of phase with respect to each other.

Furthermore, the filter adjustment circuit 100 has a reference voltage generating circuit 7 that generates a reference voltage "Vref" having a desired amplitude value, an amplitude comparator 8 that compares the amplitude value of the third signal "B'" with that of the reference voltage "Vref" and outputs the comparison result, and a control circuit 9 that outputs a control signal to the filter 4 to make the frequency of the third signal "B'" match with the cut-off frequency based on the result of the comparison by the phase comparator 6 and adjust the resistance value of the variable resistor based on the result of the comparison by the amplitude comparator 8 to make the amplitude of the third signal "B'" match with that of the reference voltage, thereby adjusting the Q factor.

The filter 4 herein is the second-order low pass filter 4 shown in FIG. 8A and described above.

As shown in FIG. 8A and described above, each of the integrators of the filter 4 has variable capacitors "C1" and "C2" connected between the input and the output of the amplifier in parallel with variable resistors "RC1" and "RC2". The filter 4 can adjust the cut-off frequency by adjusting the variable capacitors "C1" and "C2". As a result, the variable capacitances "C1" and "C2" are adjusted by a factor of $(1+\beta)$, which is determined from the Formula (16).

The reference frequency generating circuit 5 outputs a second clock signal "B" to the amplitude comparator 8 as a signal for determining the timing of comparison of the amplitude value of the third signal "B'" with that of the reference voltage "Vref". As described above, the phase of the third signal "B'" is rotated 90 degrees with respect to the phase of the second clock signal "B".

Therefore, peaks of the third signal "B'" appear at the instants of minimum values of the amplitude of the input pulse or sinusoidal wave.

Alternatively, the reference frequency generating circuit 5 may output two out-of-phase sinusoidal waves at the cut-off frequency, instead of the clock signals.

The amplitude comparator 8 generates a timing at which peaks of the output of the filter 4 appear at a frequency of "1/f0" using the clock signal "B" output from the reference frequency generating circuit 5. And the amplitude comparator 8 compares the amplitude with the reference voltage "Vref" generated by the reference circuit at that timing.

The output of the second-order low pass filter is delayed 90 degrees with respect to the input. Therefore, peaks of the third signal "B'", which is the output of the filter 4, appear at timings of rising of the second clock signal "B" which is the input pulse.

In the case where the signal input from the reference frequency generating circuit 5 to the amplitude comparator 8 is a sinusoidal wave, peaks of the third signal "B'" appear at timings when the amplitude of the sinusoidal wave becomes 0.

In the case of a third-order filter, the clock signal "B" can be 135 degrees out of phase with respect to the clock signal "A". In the case of a fourth-order filter, the clock signal "B" can be 180 degrees out of phase with respect to the clock signal "A". That is, the clock signal "B" can be out of phase with respect to the clock signal "A" by an angle of 45 degrees multiplied by the order.

Furthermore, the low pass filter may be replaced with a high pass filter. In the case of a high pass filter, the phase is advanced. For example, if the low pass filter is replaced with a second-order high pass filter, the phase is advanced 90 degrees. This is equivalent to a low pass filter that creates a phase delay of 270 degrees (a sixth-order low pass filter).

The reference voltage "Vref" output from the reference voltage generating circuit 7 is determined as the following Formula (20) by the control circuit 9 based on the Formula (17).

$$Vref = V_{in} * \frac{R_3}{R_{in1}} \sqrt{\frac{C_2 R_4}{C_1 R_{in2}}} \qquad (20)$$

If the comparison shows that the amplitude is greater than the reference voltage, the Q factor is greater than the ideal value, and if the comparison shows that the amplitude is smaller than the reference voltage "Vref", the Q factor is smaller than the ideal value. The variable resistors "Rc1" and "Rc2" can be adjusted to make the amplitude and the reference voltage "Vref" equal to each other.

Figure 11:
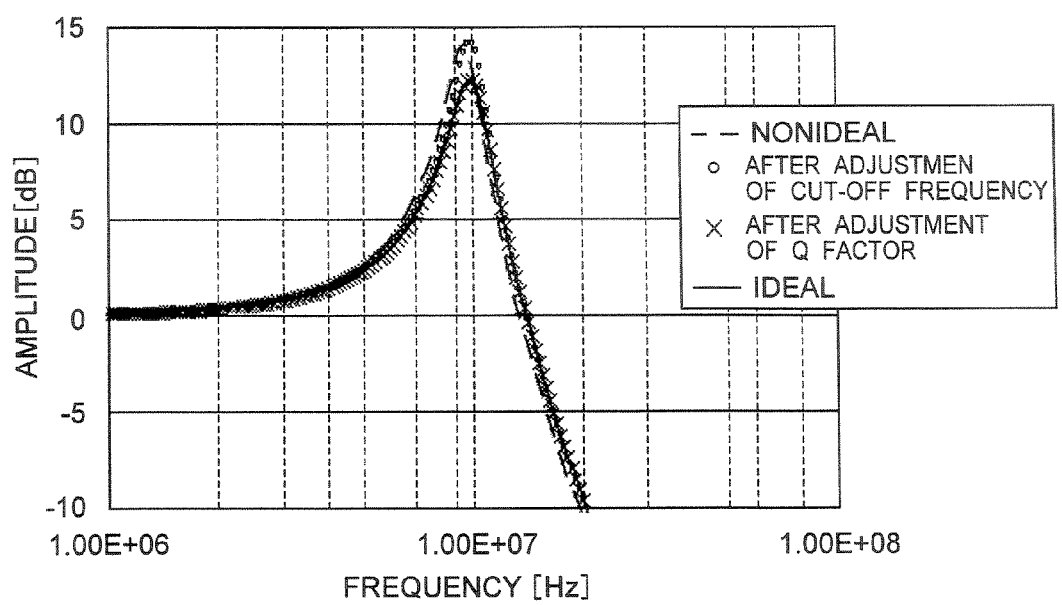
FIG. 11 shows relationships between the frequency and amplitude of the output of the low pas filter shown in FIG. 8A adjusted by the filter adjustment circuit.

FIG. 11 shows relationships between the frequency and amplitude of the output of the low pas filter shown in FIG. 8A adjusted by the filter adjustment circuit 100. It is supposed that Q=4, $f_0$=10 MHz (C1=C2=1.274 pF, R3=50 kOhm, Rin1=Rin2=R4=12.5 kOhm), the −3 dB frequency of the amplifier is 1/πMHz, and DC gain=60 dB. The cut-off frequency is adjusted by multiplying the capacitances "C1" and "C2" by 0.95 (β=−0.05), and the Q factor is adjusted by setting the resistances "Rc1" and "Rc2" at 500 kOhm.

As can be seen from FIG. 11, by adjusting the Q factor and the cut-off frequency, the output characteristics of the filter approach the ideal value. Alternatively, the same effect can be achieved by multiplying the resistances of all the resistors "R1" to "R4" by 0.95.

As described above, the filter adjustment circuit according to this embodiment can produce a desired Q factor of a filter.

Embodiment 2

With regard to the embodiment 1, there has been described a case where a low pass filter having a variable resistor and a variable capacitor connected in parallel to each other is used with the filter adjustment circuit.

As discussed with regard to the embodiment 1, the resistors "$R_{real1}$" and "$R_{real2}$" have frequency characteristics, and variable resistors "Rc1" and "Rc2" that cancel the resistances "$R_{real1}$" and "$R_{real2}$" at the cut-off frequency are connected to the resistors "$R_{real1}$" and "$R_{real2}$". Thus, the Q factor can be adjusted and made to match with the characteristics of a low pass filter having an ideal amplifier at the other frequencies within the band.

According to this principle, the Q factor can be adjusted in other ways than connecting the variable resistors "Rc1" and "Rc2" as shown in FIG. 8A.

Thus, with regard to an embodiment 2, there will be described a case where a low pass filter having a variable resistor and a variable capacitor connected in series to each other is used with the filter adjustment circuit.

Figure 12A:
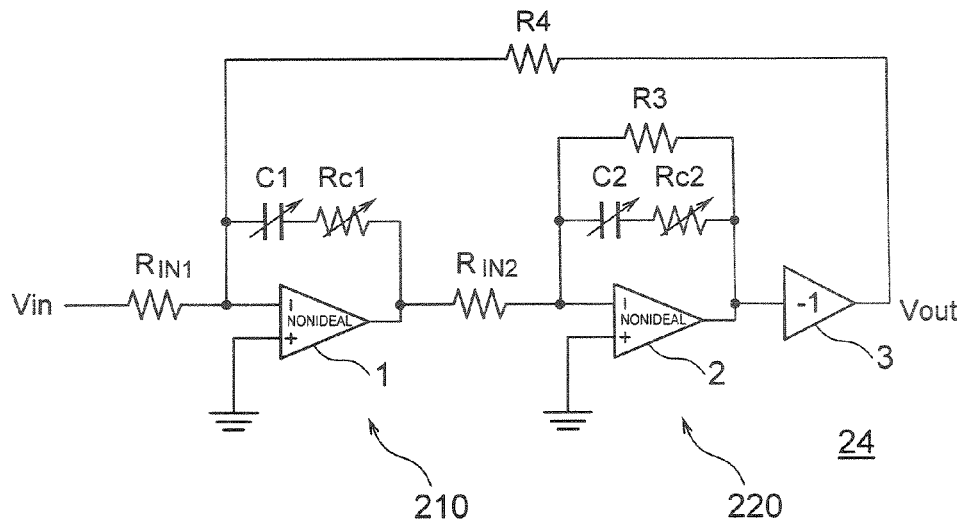
FIG. 12A is a circuit diagram of a low pass filter incorporating nonideal amplifiers used in this embodiment.

FIG. 12A is a circuit diagram of a low pass filter incorporating nonideal amplifiers used in this embodiment.

As shown in FIG. 12A, a low pass filter 24 capable of adjusting the cut-off frequency has an amplifier 210 to which a signal "Vin" is input, an amplifier 220 that has an input connected to the output of the amplifier 210, an inverting amplifier 3 that has an input connected to the output of the amplifier 220 and outputs a signal "Vout", and a resistor "R4" connected between the output of the inverting amplifier 3 and a noninverting input of the amplifier 210.

The amplifier 210 has a nonideal amplifier 1 having a noninverting input connected to the ground potential, a resistor "Rin1" that is connected to an inverting input of the nonideal amplifier 1 at one end and receives the signal "Vin" at the other end, a variable resistor "Rc1" connected between the output of the nonideal amplifier 1 and the noninverting input thereof, and a variable capacitor "C1" connected between the noninverting input of the nonideal amplifier 1 and the output thereof in series with the variable resistor "Rc1".

The amplifier 220 has a nonideal amplifier 2 having a noninverting input connected to the ground potential, a resistor "Rin2" that is connected to an inverting input of the nonideal amplifier 2 at one end and connected to the output of the nonideal amplifier 1 at the other end, a variable resistor "Rc2" connected between the noninverting input of the nonideal amplifier 2 and the output thereof, a variable capacitor "C2" connected between the noninverting input of the nonideal amplifier 2 and the output thereof in series with the variable resistor "Rc2", and a resistor "R3" connected between the output of the nonideal amplifier 2 and the noninverting input thereof.

The filter 24 adjusts the cut-off frequency by adjusting the variable capacitors "C1" and "C2".

Figure 12B:
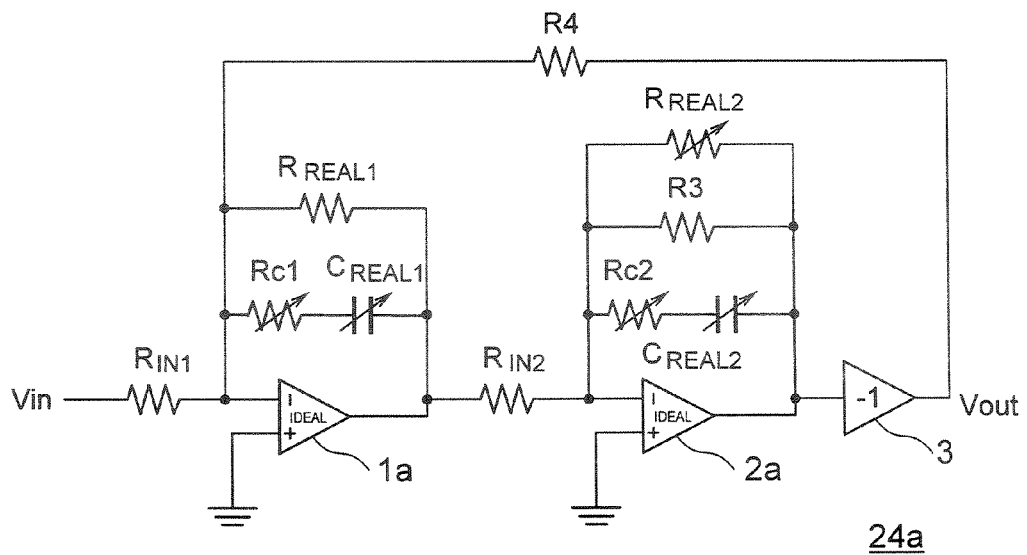
FIG. 12B is an equivalent circuit diagram taking into account the nonideal effect of the low pass filter shown in FIG. 12A.

Taking into account the nonideal effect of the low pass filter shown in FIG. 12A, the circuit diagram of FIG. 12A can be transformed into the equivalent circuit diagram of FIG. 12B.

The configuration of the filter adjustment circuit according to the embodiment 2 of the present invention is the same as that shown in FIG. 9. In addition, the adjustment methods for the cut-off frequency and the Q factor are also the same as described above.

The filter adjustment circuit adjusts the cut-off frequency and the Q factor, and as a result, relations expressed by the following Formulas (21a) and (21b) hold.

$$R_{real1} = R_{c1} + \frac{1}{((1+\beta)2\pi f_0 C_{real1})^2 R_{c1}} \qquad (21a)$$

$$R_{real2} = R_{c2} + \frac{1}{((1+\beta)2\pi f_0 C_{real2})^2 R_{c2}} \qquad (21b)$$

Figure 13:
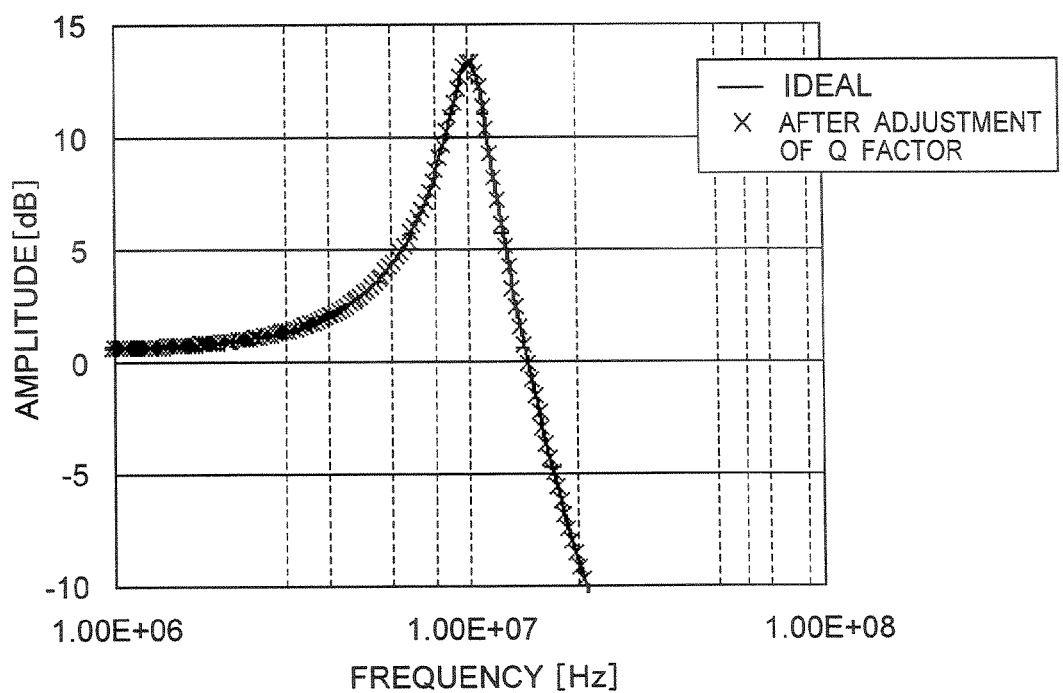
FIG. 13 shows relationships between the frequency and amplitude of the output of the low pas filter shown in FIG. 12A adjusted by the filter adjustment circuit.

FIG. 13 shows relationships between the frequency and amplitude of the output of the low pas filter shown in FIG. 12A adjusted by the filter adjustment circuit 100. It is supposed that Q=4, $f_0$=10 MHz (C1=C2=1.274 pF, R3=50 kOhm, Rin1=Rin2=R4=12.5 kOhm), the −3 dB frequency of the amplifier is 1/πMHz, and DC gain=60 dB. The cut-off frequency is adjusted by multiplying the capacitances "C1" and "C2" by 0.95 (β=−0.05), and the Q factor is adjusted by setting the resistances "Rc1" and "Rc2" at 360 kOhm.

As can be seen from FIG. 13, by adjusting the Q factor and the cut-off frequency, the output characteristics of the filter approach the ideal value. The resistances Rc1 and Rc2 can be reduced compared with the embodiment 1. Alternatively, the same effect can be achieved by multiplying the resistances of all the resistors "R1" to "R4" by 0.95.

As described above, the filter adjustment circuit according to this embodiment can produce a desired Q factor of a filter.

Embodiment 3

With regard to the embodiments 1 and 2, there has been described a circuit configuration that adjusts the cut-off frequency by adjusting the capacitance of the variable capacitor in the filter and adjusts the Q factor by adjusting the resistance of the variable resistor in the filter.

According to the Formulas (12a) and (12b), it can be considered that the Q factor can be made equal to the ideal value if the resistances "$R_{real1}$" and "$R_{real2}$" in the equivalent circuit are cancelled at the cut-off frequency by the variable resistors "Rc1" and "Rc2".

According to the Formula (4), when Rreal=0, the phase of the integrator rotates 90 degrees. Therefore, if an oscillator is formed by two integrators, and the oscillating frequency, which equals to the frequency rotated 180 degrees, that is, the frequency at which the resistances "$R_{real1}$" and "$R_{real2}$" are cancelled, is adjusted to the cut-off frequency of the filter, the Q factor can be made equal to the ideal value.

Thus, with regard to an embodiment 3, there will be described a circuit configuration that adjusts the Q factor of a filter to an ideal value by using an oscillator having the same variable resistor as the filter to be adjusted, adjusting the resistance of the variable resistor in the oscillator to make the oscillating frequency equal to the cut-off frequency, and adjusting the resistance of the variable resistor in the filter to the resulting resistance value of the variable resistor in the oscillator.

Figure 14:
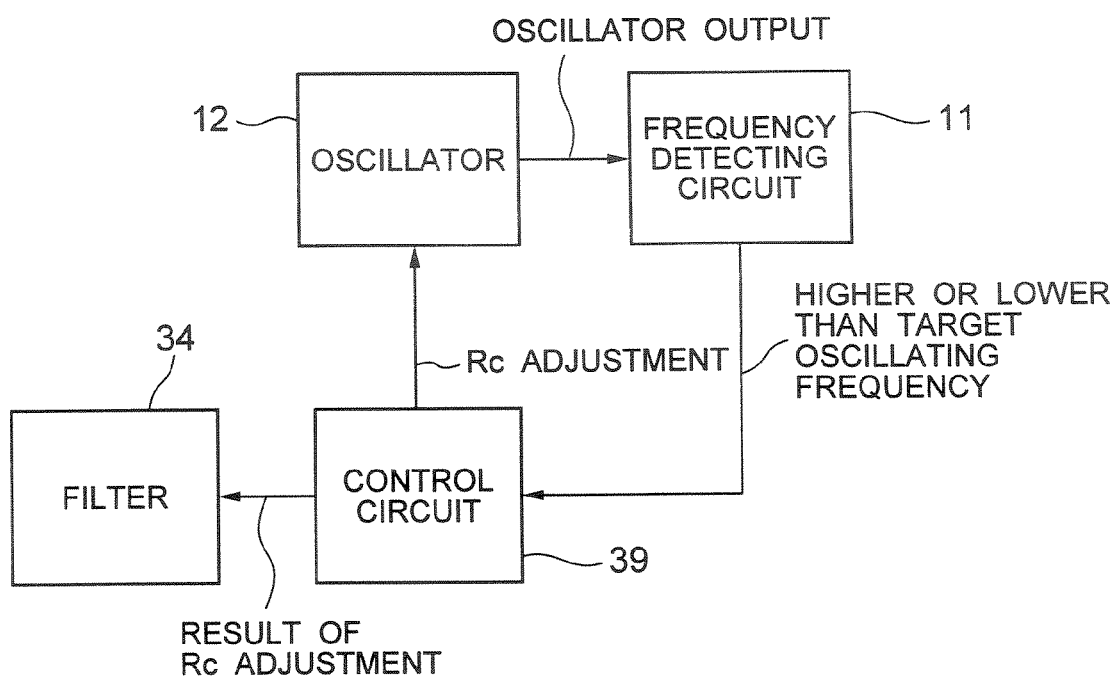
FIG. 14 is a diagram showing a configuration of a filter adjustment circuit according the embodiment 3 of the present invention.

FIG. 14 is a diagram showing a configuration of a filter adjustment circuit according the embodiment 3 of the present invention.

As shown in FIG. 14, a filter adjustment circuit 300 has a filter 34 capable of adjusting the cut-off frequency that is composed of a plurality of integrators connected to each other, each of which has an amplifier, a resistor connected to the input of the amplifier, a capacitor connected between the input and the output of the amplifier, and a variable resistor connected between the input and the output of the amplifier, and an oscillator 12 that is composed of a plurality of integrators connected to each other in the same manner as the filter 34 and has an oscillating frequency that can be adjusted by adjusting the variable resistors in the integrators.

Furthermore, the filter adjustment circuit 300 has a frequency detecting circuit 11 that detects the oscillating frequency of the oscillator 12 and a control circuit 39 that outputs a control signal to the oscillator 12 to adjust the variable resistance based on the result of the detection by the frequency detecting circuit 11 to adjust the oscillating frequency to the cut-off frequency and outputs a control signal to the filter 34 to adjust the resistance value of the variable resistor in the integrator in the filter 34 to the resistance value of the adjusted variable resistor.

For example, the filter 34 may be the second-order low pass filter 4 or 24 shown in FIG. 8A or 12A described above. The capacitors "C1" and "C2" may not be variable ones.

For example, the frequency detecting circuit 11 may be constituted by a reference frequency counter Supposing that, in a duration "xT" in which the reference frequency with a period "T" is counted "x" times, the output of the oscillator 12 is counted, and the count is denoted by "y", the oscillating frequency can be expressed as "y/xT".

Figure 15A:
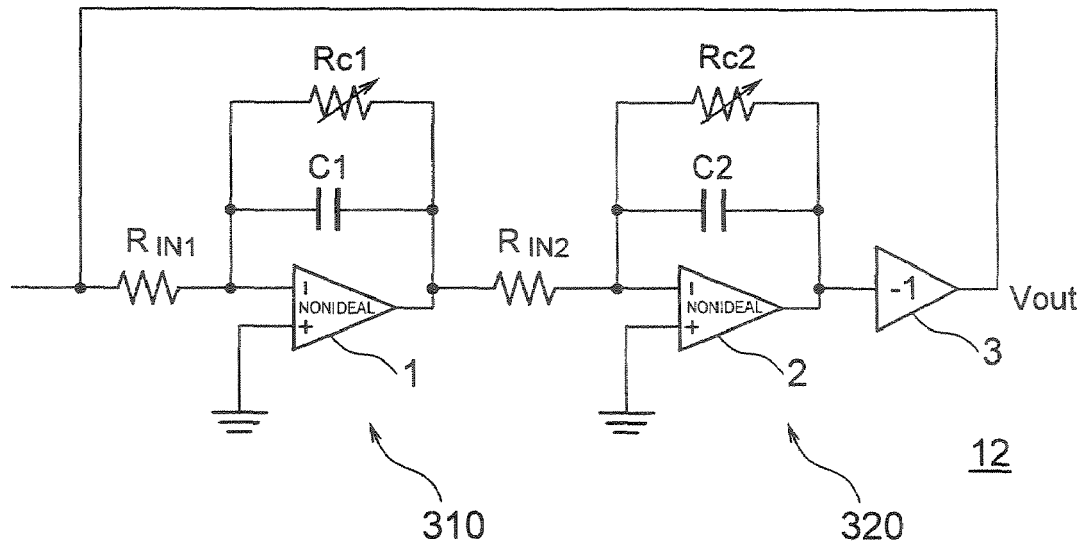
FIG. 15A is a circuit diagram of an example of the oscillator 12 incorporating nonideal amplifiers used in this embodiment.

FIG. 15A is a circuit diagram of an example of the oscillator 12 incorporating nonideal amplifiers used in this embodiment.

As shown in FIG. 15A, the oscillator 12 capable of adjusting the oscillating frequency has an amplifier 310, an amplifier 320 having an input connected to the output of the amplifier 310, and an inverting amplifier 3 that has an input connected to the output of the amplifier 320 and outputs a signal "Vout".

The amplifier 310 has a nonideal amplifier 1 having a noninverting input connected to the ground potential, a resistor "Rin1" that is connected to an inverting input of the nonideal amplifier 1 at one end and is connected to the output of the inverting amplifier at the other end, a variable resistor "Rc1" connected between the output of the nonideal amplifier 1 and the noninverting input thereof, and a variable capacitor "C1" connected between the noninverting input of the nonideal amplifier 1 and the output thereof in parallel with the variable resistor "Rc1".

The amplifier 320 has a nonideal amplifier 2 having a noninverting input connected to the ground potential, a resistor "Rin2" that is connected to an inverting input of the nonideal amplifier 2 at one end and connected to the output of the nonideal amplifier 1 at the other end, a variable resistor "Rc2" connected between the noninverting input of the nonideal amplifier 2 and the output thereof, and a variable capacitor "C2" connected between the noninverting input of the nonideal amplifier 2 and the output thereof in parallel with the variable resistor "Rc2".

The oscillator 12 adjusts the oscillating frequency by adjusting the variable resistors "Rc1" and "Rc2".

Figure 15B:
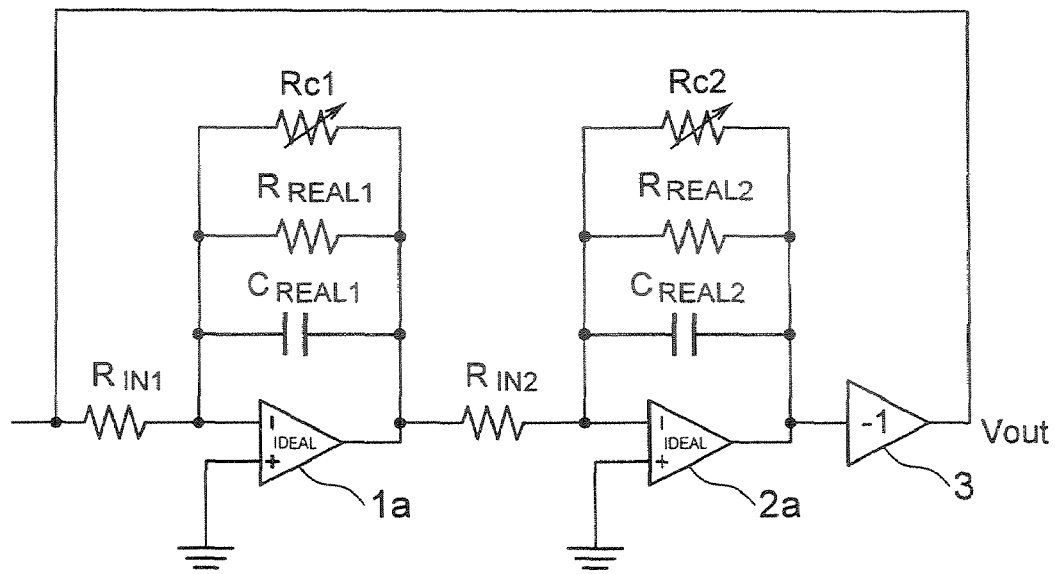
FIG. 15B is an equivalent circuit diagram taking into account the nonideal effect of the oscillator shown in FIG. 15A.

Taking into account the nonideal effect of the oscillator shown in FIG. 15A, the circuit diagram of FIG. 15A can be transformed into the equivalent circuit diagram of FIG. 15B.

Figure 16A:
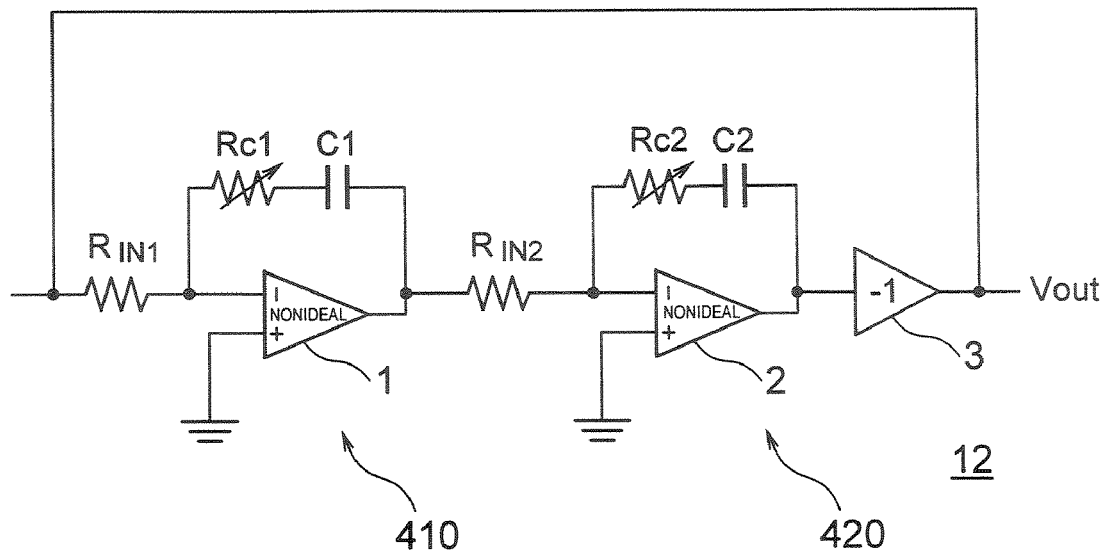
FIG. 16A is a circuit diagram of another example of the oscillator 12 incorporating nonideal amplifiers used in this embodiment.

FIG. 16A is a circuit diagram of another example of the oscillator 12 incorporating nonideal amplifiers used in this embodiment.

As shown in FIG. 16A, the oscillator 12 capable of adjusting the oscillating frequency has an amplifier 410, an amplifier 420 having an input connected to the output of the amplifier 410, and an inverting amplifier 3 that has an input connected to the output of the amplifier 420 and outputs a signal "Vout".

The amplifier 410 has a nonideal amplifier 1 having a noninverting input connected to the ground potential, a resistor "Rin1" that is connected to an inverting input of the nonideal amplifier 1 at one end and is connected to the output of the inverting amplifier at the other end, a variable resistor "Rc1" connected between the output of the nonideal amplifier 1 and the noninverting input thereof, and a variable capacitor "C1" connected between the noninverting input of the nonideal amplifier 1 and the output thereof in series with the variable resistor "Rc1".

The amplifier 420 has a nonideal amplifier 2 having a noninverting input connected to the ground potential, a resistor "Rin2" that is connected to an inverting input of the nonideal amplifier 2 at one end and connected to the output of the nonideal amplifier 1 at the other end, a variable resistor "Rc2" connected between the noninverting input of the nonideal amplifier 2 and the output thereof, and a variable capacitor "C2" connected between the noninverting input of the nonideal amplifier 2 and the output thereof in series with the variable resistor "Rc2".

The oscillator 12 adjusts the oscillating frequency by adjusting the variable resistors "Rc1" and "Rc2".

Figure 16B:
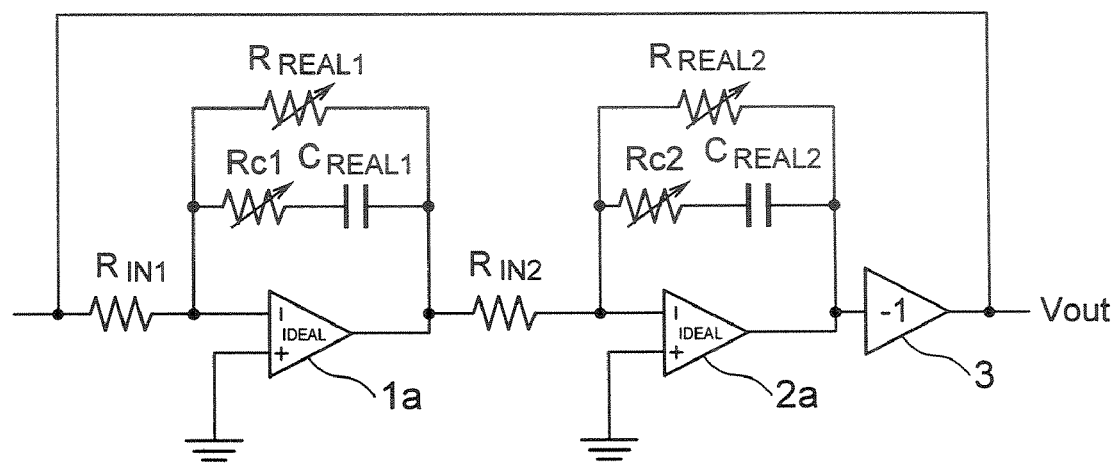
FIG. 16B is an equivalent circuit diagram taking into account the nonideal effect of the oscillator shown in FIG. 16A.

Taking into account the nonideal effect of the oscillator shown in FIG. 16A, the circuit diagram of FIG. 16A can be transformed into the equivalent circuit diagram of FIG. 16B.

Alternatively, an integrator incorporating only the resistor "$R_{real1}$" and an integrator incorporating only the resistor "$R_{real2}$" may be separately prepared, and the resistances "$R_{real1}$" and "$R_{real2}$" may be each adjusted to 0. As in the embodiments 1 and 2, in the case of the differential configuration, the inverting amplifier 3 of the oscillator 12 can be omitted.

As described above, the filter adjustment circuit according to this embodiment can produce a desired Q factor of a filter.

Embodiment 4

With regard to the embodiment 1, for example, there has been described a configuration of a filter adjustment circuit for adjusting the Q factor of a second-order filter. However, with regard to an embodiment 4, a configuration of a filter adjustment circuit for adjusting the Q factor of a fourth- or higher-order filter will be described.

In the case of the fourth- or higher-order low pass filter, similarly, the Q factor of the filter can be adjusted, and the frequency characteristics thereof can be brought close to the ideal characteristics by adjusting the Q factor at the highest cut-off frequency. For example, the transfer function of a fifth-order LPF is expressed by the following Formula (22).

$$\frac{Vout}{Vin} = \frac{A(2\pi f_1)(2\pi f_2)^2(2\pi f_3)^2}{(s+2\pi f_1)\left(s^2 + \frac{2\pi f_2}{Q_2}s + (2\pi f_2)^2\right)\left(s^2 + \frac{2\pi f_3}{Q_3}s + (2\pi f_3)^2\right)} \quad (22)$$

In the Formula (22), if the cut-off frequency "$f_2$" is lower than the cut-off frequency "$f_3$", the Q factor "$Q_2$" is smaller than the Q factor "$Q_3$". As is apparent from the Formulas (7), (12a) and (12b), the resistance "$R_{real}$" has a greater effect on the Q factor "$Q_{real}$" as the Q factor "$Q_{ideal}$" increases. In addition, as can be seen from the Formula (7), as the frequency becomes higher, the resistance "$R_{real}$" decreases, and the Q factor "$Q_3$" substantially increases, although the Q factor "$Q_2$" does not vary significantly.

Therefore, the Q factor can be adjusted in the manner according to the embodiment 1, 2 or 3 so that the Q factor "$Q_3$" is adjusted to the ideal value at the cut-off frequency "$f_3$" using the second-order filter as in the embodiment 1 or 2 or using the oscillator as in the embodiment 3.

Furthermore, if all the cut-off frequencies "$f_1$", "$f_2$" and "$f_3$" of the filter are equal to each other, the fifth-order filter can be directly adjusted in the manner according to the embodiment 1, 2. The amount of rotation of the phase at the cut-off frequency depends on the order of the filter, and therefore, the phase has to be adjusted according to the order to generate the reference frequency.

Now, there will be described a filter adjustment circuit according to this embodiment that adjusts the Q factor of a high-order filter based on the principle described above. In the following, there will be described a case where a fifth-order low pass filter is adjusted as an example. However, the present invention can be equally applied to any filter that has a similar configuration.

Figure 17:
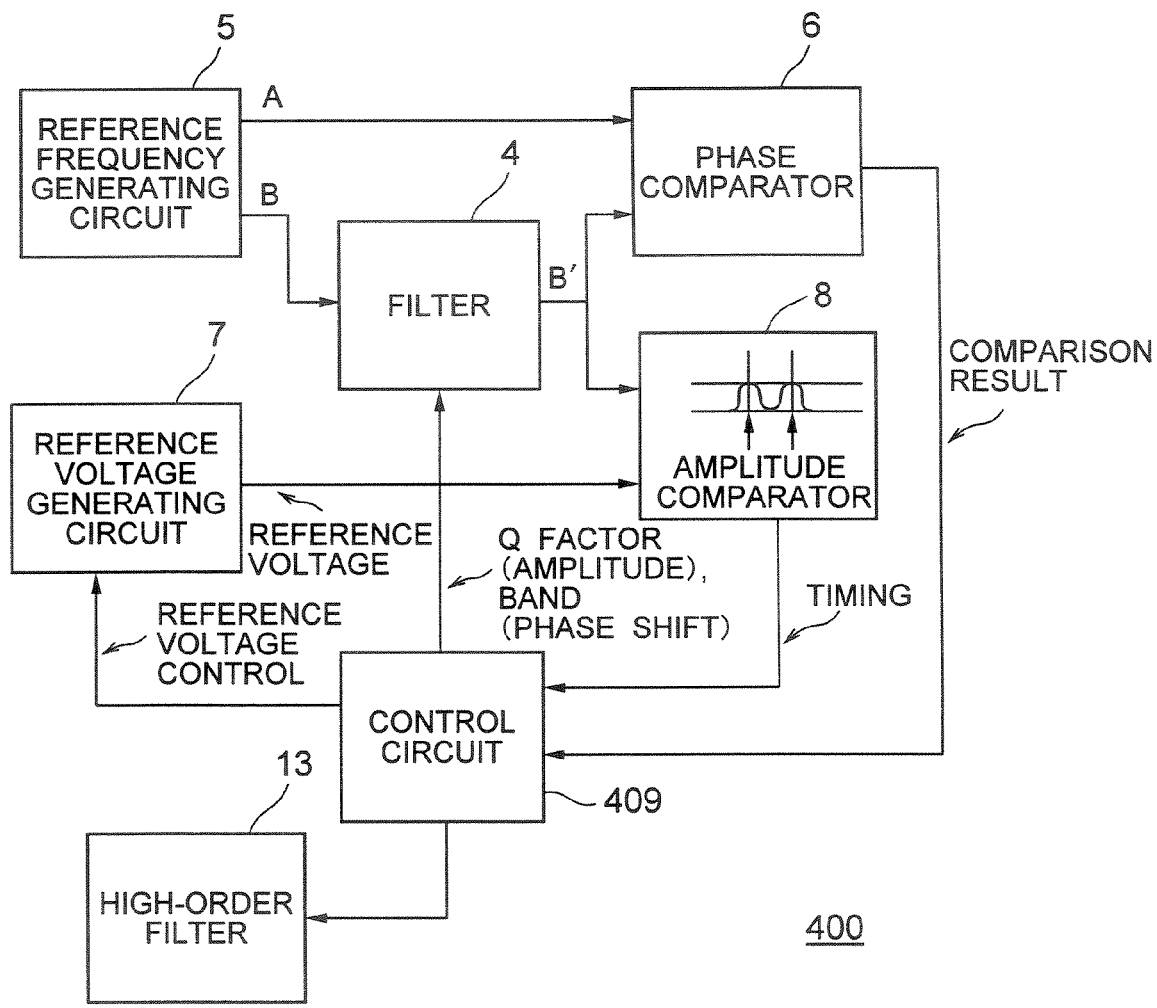
FIG. 17 is a block diagram showing a configuration of essential parts of a filter adjustment circuit 400 according to the embodiment 4, which is an aspect of the present invention.

FIG. 17 is a block diagram showing a configuration of essential parts of a filter adjustment circuit 400 according to the embodiment 4, which is an aspect of the present invention. In this drawing, the same reference numerals as those in the embodiment 1 denote the same parts as those in the embodiment 1.

As shown in FIG. 17, a filter adjustment circuit 400 has the filter 4 capable of adjusting the cut-off frequency that is composed of a plurality of integrators connected to each other, each of which has an amplifier and a variable resistor connected between the input and the output of the amplifier.

Furthermore, the filter adjustment circuit 400 has a reference frequency generating circuit 5 that outputs a first clock signal "A" having the cut-off frequency and outputs a second clock signal "B" 90 degrees out of phase with respect to the first clock signal "A" to the filter 4, and a phase comparator 6 that compares the phase of a third signal "B'", which is the second clock signal "B" processed by and output from the filter 4, with the phase of the first clock signal "A" to determine whether or not the frequencies of the signals match with each other.

Furthermore, the filter adjustment circuit 400 has a reference voltage generating circuit 7 that generates a reference voltage "Vref" having a desired amplitude value, an amplitude comparator 8 that compares the amplitude value of the third signal "B'" with that of the reference voltage "Vref" and outputs the comparison result, and a control circuit 409 that outputs a control signal to the filter 4 to make the frequency of the third signal "B'" match with the cut-off frequency based on the result of the comparison by the phase comparator 6 and adjust the resistance value of the variable resistor based on the result of the comparison by the amplitude comparator 8 to make the amplitude of the third signal match with that of the reference voltage, thereby adjusting the Q factor.

Furthermore, the filter adjustment circuit 400 has a fifth-order filter 13 capable of adjusting the cut-off frequency that is composed of a plurality of integrators connected to each other, each of which has an amplifier, a variable resistor connected between the input and the output of the amplifier and a variable capacitor connected between the input and the output of the amplifier.

The filter 4 is a second-order low pass filter and has a cut-off frequency of "$f_3$" and a Q factor of "$Q_3$". These values are adjusted to their respective desired ideal values as in the embodiment 1.

The control circuit 409 applies to the fifth-order filter 13 the values of the variable resistance and the variable capacitance after the values "$f_3$" and "$Q_3$" are adjusted to the desired ideal values as in the embodiment 1. Thus, the Q factor "$Q_3$" of the fifth-order filter 13 can also be adjusted to the ideal value.

Figure 18:
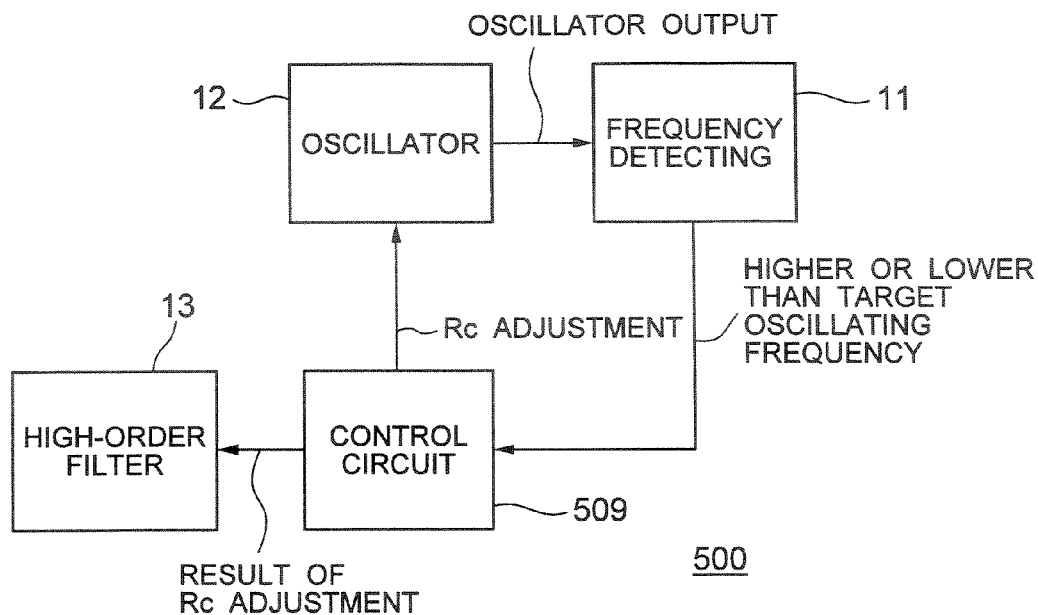
FIG. 18 is a block diagram showing a configuration of essential parts of a filter adjustment circuit 500 according to the embodiment 4, which is an aspect of the present invention.

Alternatively, as described above, the Q factor of the high-order filter can be adjusted in the manner according to the embodiment 3 FIG. 18 is a block diagram showing a configuration of essential parts of a filter adjustment circuit 500 according to the embodiment 4, which is an aspect of the present invention. In this drawing, the same reference numerals as those in the embodiment 3 denote the same parts as those in the embodiment 3.

As shown in FIG. 18, a filter adjustment circuit 500 has a fifth-order filter 13 capable of adjusting the cut-off frequency that is composed of a plurality of integrators connected to each other, each of which has an amplifier, a resistor connected to the input of the amplifier, a capacitor connected between the input and the output of the amplifier, and a variable resistor connected between the input and the output of the amplifier, and an oscillator 12 that is composed of integrators connected to each other and has an oscillating frequency that can be adjusted by adjusting the variable resistors in the integrators.

Furthermore, the filter adjustment circuit 500 has a frequency detecting circuit 11 that detects the oscillating frequency of the oscillator 12 and a control circuit 509 that outputs a control signal to the oscillator 12 to adjust the variable resistance based on the result of the detection by the frequency detecting circuit 11 to adjust the oscillating frequency to the cut-off frequency and outputs a control signal to the filter 13 to adjust the resistance value of the variable resistor in the integrator in the filter 13 to the resistance value of the adjusted variable resistor.

For example, the filter 13 may be a fifth-order low pass filter that has the transfer function expressed by the Formula (22) described above and has cut-off frequencies of "$f_1$", "$f_2$" and "$f_3$" and Q factors "$Q_1$", "$Q_2$" and "$Q_3$".

The control circuit 509 applies to the fifth-order filter 13 the values of the variable resistance and the variable capacitance after the value "$f_3$" is adjusted to the oscillating frequency as in the embodiment 3. Thus, the Q factor "$Q_3$" of the fifth-order filter 13 can also be adjusted to the ideal value.

As described above, the filter adjustment circuit according to this embodiment can produce a desired Q factor of a fourth- or higher-order filter.

Embodiment 5

With regard to the embodiment 1, for example, there has been described a configuration in which the amplitude comparator determines the timings of peaks of the third signal "B'" based on the second clock signal "B" output from the reference frequency generating circuit and compares the amplitude of the signal "B'" at the timings with the reference voltage.

With regard to an embodiment 5, as an alternative example, there will be described a configuration in which a high-rate clock signal is used for the third signal "B'", and the amplitude of the third signal "B'" is compared with the reference voltage.

Figure 19:
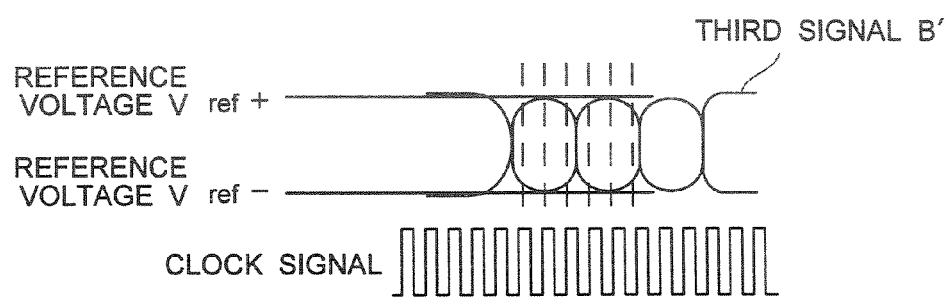
FIG. 19 is a diagram showing waveforms of a clock signal and a third signal "B'" that is compared with a reference voltage by an amplitude comparator in a filter adjustment circuit according to the embodiment 5, which is an aspect of the present invention.

FIG. 19 is a diagram showing waveforms of a clock signal and a third signal "B'" that is compared with a reference voltage by an amplitude comparator in a filter adjustment circuit according to the embodiment 5, which is an aspect of the present invention.

As shown in FIG. 19, if a clock signal having a sufficiently high rate is used for the third signal "B'", an amplitude comparator 8 compares the third signal "B'" with a reference voltage "Vref" for a desired period to determine whether the amplitude is greater than that of the reference voltage "vref" at least for a moment. The amplitude comparator 8 outputs the comparison result to a control circuit 9. Based on the comparison result, the control circuit 9 adjusts variable resistors "Rc1" and "Rc2" of a filter 4, thereby adjusting the amplitude of the third signal "B'" to the value expressed by the Formula (20). In this way, the Q factor can be adjusted to the ideal value as in the embodiment 1.

As described above, the filter adjustment circuit according to this embodiment can produce a desired Q factor of a filter as in the embodiments 1 to 4.

Embodiment 6

With regard to the embodiments 1 to 5, a configuration in which the filter has variable resistors has been described. However, with regard to an embodiment 6, a specific configuration of the variable resistors will be particularly described.

Figure 20:
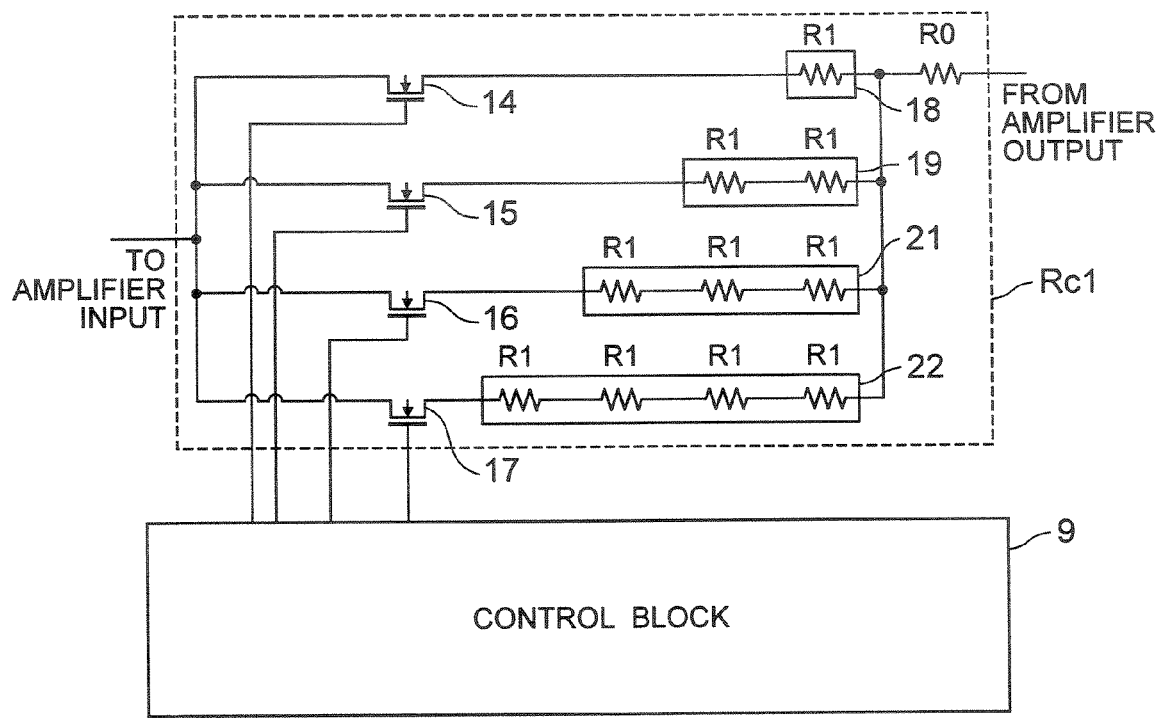
FIG. 20 is a circuit diagram showing a configuration of variable resistors in a filter adjustment circuit according to the embodiment 6, which is an aspect of the present invention.

FIG. 20 is a circuit diagram showing a configuration of variable resistors in a filter adjustment circuit according to the embodiment 6, which is an aspect of the present invention.

As shown in FIG. 20, a variable resistor "Rc1" has a plurality of resistors 19, 19, 21 and 22 that have different resistances and are connected in parallel with each other between the input and the output of the amplifier.

Furthermore, the variable resistor "Rc1" has a plurality of MOS transistors 14, 15, 16 and 17 for limiting the current flowing to the resistors 18, 19, 21 and 22, respectively, that are connected between the input of the amplifier and the resistors 18, 19, 21 and 22, respectively, and receive an ON/OFF signal from a control circuit 9 at their respective gates.

The resistance value of the variable resistor "Rc1" is changed by turning on or off the MOS transistors 14 to 17 to change the combined resistance of the resistors 18, 19, 21 and 22.

As shown in FIG. 20, the resistors 18, 19, 21 and 22 are connected to the MOS transistors 14, 15, 16 and 17 on the output side of the amplifier. Therefore, viewed from the output of the amplifier, the parasitic capacitances of the MOS transistors 14, 15, 16 and 17 are hard to recognize, and the phase rotation decreases. Therefore, the characteristics are stable independently of the resistance value of the variable resistor.

Such a configuration of the variable resistor "Rc1" can be equally applied to the variable resistor "Rc2" and the variable resistors used in the higher-order filter in the embodiments described above.

As described above, the filter adjustment circuit according to this embodiment can produce a desired Q factor of a filter and provide more stable filter characteristics.

The embodiments 1 to 6 described above can be applied not only to the low pass filter but also to a band pass filter (BPF), a high pass filter (HPF) and a band eliminate filter (BEF).

What is claimed is:

1. A filter adjustment circuit, comprising:
   a filter capable of adjusting a cut-off frequency that is composed of a plurality of integrators connected to each other, each of which has an amplifier, a resistor connected to an input of the amplifier, a capacitor connected between the input and the output of said amplifier, and a variable resistor connected between the input and the output of said amplifier;
   a reference frequency generating circuit that outputs a first signal having said cut-off frequency and outputs a second signal that is out of phase with respect to said first signal to said filter;
   a phase comparator that compares the phase of a third signal, which is said second signal processed by and output from said filter, with the phase of said first signal to determine whether or not the frequencies of the signals are equal to each other;
   a reference voltage generating circuit that generates a reference voltage having a desired amplitude value for determining a Q factor;
   an amplitude comparator that compares the amplitude value of said third signal with that of said reference voltage and outputs the comparison result; and
   a control circuit that adjusts the Q factor by outputting a control signal to said filter, thereby adjusting the frequency of said third signal to said cut-off frequency based on the comparison result from said phase comparator and adjusting the resistance value of said variable resistor based on the comparison result from said amplitude comparator to adjust the amplitude of said third signal to that of said reference voltage.

2. The filter adjustment circuit according to claim 1, wherein said capacitor is a variable capacitor connected in parallel with said variable resistor between the input and the output of said amplifier, and
   the cut-off frequency of said filter is adjusted by adjusting said variable capacitor.

3. The filter adjustment circuit according to claim 1, wherein said capacitor is a variable capacitor connected in series with said variable resistor between the input and the output of said amplifier, and
   the cut-off frequency of said filter is adjusted by adjusting said variable capacitor.

4. The filter adjustment circuit according to claim 1, wherein said variable resistor has a plurality of resistors that have different resistances and are connected in parallel with each other between the input and the output of said amplifier, and a plurality of MOS transistors for limiting the current flowing to said resistors that are connected between the respective resistors and the input of said amplifier and receive an ON/OFF signal from said control circuit at respective gates.

5. The filter adjustment circuit according to claim 2, wherein said variable resistor has a plurality of resistors that have different resistances and are connected in parallel with each other between the input and the output of said amplifier, and a plurality of MOS transistors for limiting the current flowing to said resistors that are connected between the respective resistors and the input of said amplifier and receive an ON/OFF signal from said control circuit at respective gates.

6. The filter adjustment circuit according to claim 3, wherein said variable resistor has a plurality of resistors that have different resistances and are connected in parallel with each other between the input and the output of said amplifier, and a plurality of MOS transistors for limiting the current flowing to said resistors that are connected between the respective resistors and the input of said amplifier and receive an ON/OFF signal from said control circuit at respective gates.

7. A filter adjustment circuit comprising:
- a filter capable of adjusting a cut-off frequency that is composed of a plurality of integrators connected to each other, each of which has an amplifier, a resistor connected to an input of the amplifier, a capacitor connected between the input and the output of said amplifier, and a variable resistor connected between the input and the output of said amplifier;
- an oscillator that is composed of a plurality of integrators connected to each other having the same configuration as said integrators and is capable of adjusting the oscillating frequency by adjusting the variable resistors of the integrators;
- a frequency detecting circuit that detects the oscillating frequency of said oscillator; and
- a control circuit that outputs a control signal to said oscillator to adjust said variable resistors of said integrators of said oscillator based on the detection result from said frequency detecting circuit to adjust said oscillating frequency to said cut-off frequency and outputs a control signal to said filter to adjust the resistance value of said variable resistors of said integrators of said filter to the adjusted resistance values of said variable resistors of said integrators of said oscillator.

8. The filter adjustment circuit according to claim 7, wherein said variable resistor is connected in parallel with said capacitor between the input and the output of said amplifier.

9. The filter adjustment circuit according to claim 7, wherein said variable resistor is connected in series with said capacitor between the input and the output of said amplifier.

10. The filter adjustment circuit according to claim 7, wherein said variable resistor has a plurality of resistors that have different resistances and are connected in parallel with each other between the input and the output of said amplifier, and a plurality of MOS transistors for limiting the current flowing to said resistors that are connected between the respective resistors and the input of said amplifier and receive an ON/OFF signal from said control circuit at respective gates.

11. The filter adjustment circuit according to claim 8, wherein said variable resistor has a plurality of resistors that have different resistances and are connected in parallel with each other between the input and the output of said amplifier, and a plurality of MOS transistors for limiting the current flowing to said resistors that are connected between the respective resistors and the input of said amplifier and receive an ON/OFF signal from said control circuit at respective gates.

12. The filter adjustment circuit according to claim 9, wherein said variable resistor has a plurality of resistors that have different resistances and are connected in parallel with each other between the input and the output of said amplifier, and a plurality of MOS transistors for limiting the current flowing to said resistors that are connected between the respective resistors and the input of said amplifier and receive an ON/OFF signal from said control circuit at respective gates.

* * * * *